(12) United States Patent
Shanmugam et al.

(10) Patent No.: US 11,532,563 B2
(45) Date of Patent: Dec. 20, 2022

(54) PACKAGE INTEGRATION USING FANOUT CAVITY SUBSTRATE

(71) Applicant: Apple Inc., Cupertino, CA (US)

(72) Inventors: Karthik Shanmugam, Singapore (SG); Jun Zhai, Cupertino, CA (US); Rajasekaran Swaminathan, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/026,708

(22) Filed: Sep. 21, 2020

(65) Prior Publication Data

US 2022/0093522 A1    Mar. 24, 2022

(51) Int. Cl.
| | | |
|---|---|---|
| H01L 23/538 | (2006.01) | |
| H01L 23/31 | (2006.01) | |
| H05K 1/18 | (2006.01) | |
| H01L 21/56 | (2006.01) | |
| H01L 25/16 | (2006.01) | |

(52) U.S. Cl.
CPC ........ *H01L 23/5389* (2013.01); *H01L 21/561* (2013.01); *H01L 21/568* (2013.01); *H01L 23/3128* (2013.01); *H01L 25/165* (2013.01); *H01L 25/167* (2013.01); *H05K 1/185* (2013.01)

(58) Field of Classification Search
CPC ............. H01L 25/0652; H01L 23/3128; H01L 23/3135; H01L 23/367; H01L 23/481; H01L 23/5383; H01L 23/5385
See application file for complete search history.

(56) References Cited

U.S. PATENT DOCUMENTS

| | | | |
|---|---|---|---|
| 8,076,788 B2 * | 12/2011 | Haba | H01L 23/5382 257/786 |
| 8,349,653 B2 | 1/2013 | Parvarandeh | |
| 8,426,961 B2 * | 4/2013 | Shih | H01L 23/5389 257/698 |
| 9,202,716 B2 | 12/2015 | Park et al. | |
| 9,704,809 B2 | 7/2017 | Tran et al. | |
| 10,504,841 B2 | 12/2019 | Huang | |
| 2003/0218263 A1 * | 11/2003 | Blaszczak | H01L 24/48 257/788 |
| 2010/0013087 A1 * | 1/2010 | England | H01L 24/19 257/700 |
| 2014/0252655 A1 * | 9/2014 | Tran | H01L 21/4803 257/777 |
| 2017/0053903 A1 * | 2/2017 | Nishimura | H01L 33/56 |
| 2019/0164865 A1 * | 5/2019 | Elger | H01L 23/3735 |

* cited by examiner

*Primary Examiner* — Fernando L Toledo
*Assistant Examiner* — Neil R Prasad
(74) *Attorney, Agent, or Firm* — Aikin & Gallant, LLP

(57) ABSTRACT

Packages and packaging techniques are described in which a patterned carrier substrate can be used to create a reconstituted fanout substrate with a topography that can accommodate components of different thicknesses. In an embodiment, a wiring layer is formed directly on a multiple level topography of a molding compound layer including embedded components.

16 Claims, 7 Drawing Sheets

PACKAGE INTEGRATION USING FANOUT CAVITY SUBSTRATE

BACKGROUND

Field

Embodiments described herein relate to microelectronic packaging, and more particularly to fanout packages.

Background Information

The current market demand for portable and mobile electronic devices such as mobile phones, personal digital assistants (PDAs), digital cameras, portable players, gaming, and other mobile devices requires the integration of more performance and features into increasingly smaller spaces. A traditional microelectronic module may include one or more semiconductor packages and other components mounted onto a circuit board. Packaging solutions such as wafer level chip scale package (WLCSP) technology can allow the semiconductor packages to be no larger than the dice (chips) themselves, further allowing a reduction of footprint (e.g. area). In a traditional module, packages are mounted on a circuit board adjacent to a plurality of passive components that can provide supplemental features such as filtering applications, power supplies, etc.

Various multiple-die packaging solutions such as system in package (SiP) and package on package (PoP) have also become more popular to meet the demand for higher die/component density devices. In SiP a number of different system components can be enclosed within a single package. Thus, the SiP may perform all or most of the functions of an electronic system portion of a module. Integration of more components into a single package may also be associated with multiple package levels. While this may often allow for reduced footprint (e.g. area), increased package levels can also lead to an increase in form factor (e.g. thickness) and the number of input/output (I/O) pads for the package.

SUMMARY

Packages and packaging techniques are described in which a patterned carrier substrate can be used to create a reconstituted fanout substrate with a topography that can accommodate components of different thicknesses. In an embodiment, a packaging sequence includes placing first components onto a lower surface of a carrier substrate that includes a raised surface, the lower surface, and sidewalls extending between the lower surface and the raised surface. Second components can optionally also be placed on the raised surface of the carrier substrate. The first components and optional second components are then encapsulated in a molding compound layer, followed by removal of the carrier substrate to expose the first components and optional second components. A wiring layer can then be formed over a multiple level topography of the molding compound layer, the first components and the optional second components. Such a reconstituted fanout substrate can then be further processed and singulated to form a variety of package structures.

In an embodiment, a package includes a first component and optional second component encapsulated in a molding compound layer. A first wiring layer is formed over a topography of the molding compound layer, the first component and optional second component. The topography may include a molded surface profile including a top surface, a floor surface, and mold sidewalls extending from the floor surface to the top surface. In such an embodiment, the first wiring layer is formed directly on and in electrical contact with a first face of the first component along the top surface of the molded surface profile, and directly on and in electrical contact with a second face of the optional second component along the floor surface of the molded surface profile. Thus, the floor surface may be a lower elevation that the top surface.

DETAILED DESCRIPTION

Embodiments describe packaging techniques that utilize a patterned carrier substrate to create a reconstituted fanout substrate with a topography that can accommodate components of different thicknesses. In an embodiment, a packaging sequence includes placing first components onto a lower surface of a carrier substrate that includes a raised surface, the lower surface, and sidewalls extending between the lower surface and the raised surface. Second components can optionally also be placed on the raised surface of the carrier substrate. The first components and optional second components are then encapsulated in a molding compound layer, followed by removal of the carrier substrate to expose the first components and optional second components. A wiring layer can then be formed over a multiple level topography of the molding compound layer, the first components and the optional second components. Such a reconstituted fanout substrate can then be further processed and singulated to form a variety of package structures.

In one aspect, embodiments describe a packaging sequence which utilizes a topography of a carrier substrate to form a reconstituted fanout substrate with a topography that can accommodate components of different thicknesses. Furthermore, such topography can be utilized to form a conformal wiring layer to connect various components of different thicknesses.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1A:
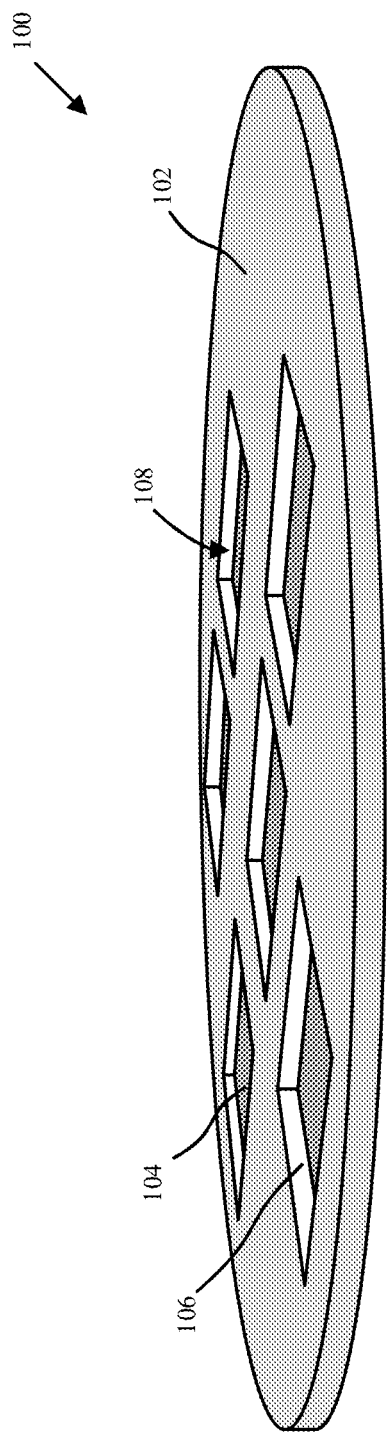
FIGS. 1A-1B are isometric view illustrations of patterned carrier substrates including a raised surface and lower surface in accordance with embodiments.
Figure 1B:

Referring now to FIGS. 1A-1B isometric view illustrations are provided of patterned carrier substrates 100 including a raised surface 102 and lower surface 104 in accordance with embodiments. The carrier substrate 100 may be formed of a variety of materials to provide a rigidity for subsequent pick and place and molding operations, such as stainless steel, other metals, silicon, glass, etc. As shown in each configuration the carrier substrate includes sidewalls 106 extending between the lower surface 104 and the raised surface 102. In the particular embodiment illustrated in FIG. 1A, cavities 108 are etched into the raised surface 102 to form the lower surface 104 and sidewalls 106. In the particular embodiment illustrated in FIG. 1B, the carrier substrate body is etched to form the lower surface 104 and sidewalls 106 and resulting mesas 110. It is to be appreciated that much more complex arrangements can be provided and that embodiments are not limited to discrete, separate cavities 108 or mesas 110, and that such structures can be connected in more complex designs, including combinations of FIGS. 1A and 1B. Furthermore, while embodiments are described with regard to a two-level carrier substrate 100 with a raised surface 102 and lower surface 104, that additional intermediate surfaces can also be included to support components with different thicknesses.

Figure 2:
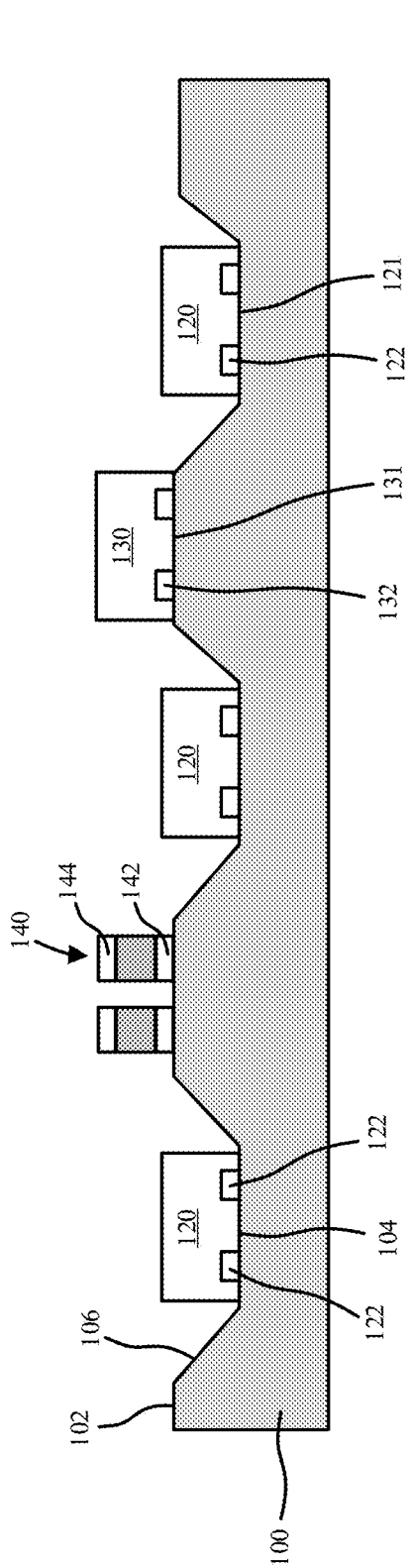
FIG. 2 is a schematic cross-sectional side view illustration of a plurality of components mounted on the raised and lower surfaces of a patterned carrier substrate in accordance with an embodiment.

FIG. 2 is a schematic cross-sectional side view illustration of a plurality of components mounted on the raised and lower surfaces of a patterned carrier substrate 100 such as those illustrated in FIGS. 1A-1B in accordance with an embodiment. The various components in accordance with embodiments may include active components (e.g., dies, integrated circuits, etc.), passive components (emitters, photodetectors, resistor, inductor, capacitor, etc.), electromechanical components, electrical connectors such as printed circuit board (PCB) bars, etc., any of which may be discrete components. In some embodiments, electrical connectors may be pre-formed pillars. For example, copper pillars can be plated prior to pick and place of the components.

Generally, the components can be placed onto the raised surface 102 and/or lower surface 104 of patterned carrier substrates 100 of FIGS. 1A-1B using a suitable pick and place tool. FIG. 2 is an illustration of components 120 placed face 121 down onto the lower surface 104 and components 130 placed face 131 down onto the raised surface 102. In such a face down placement, the terminals 122, 132 (illustrated as contact pads) for the respective components are facing the carrier substrate 100. In this example, each component 120, 130 has a single active side face, and does not include terminals on a back side of the component. However, other configurations may include components with both front and back side connections (contact pads). Components 140 including terminals 142, 144 (illustrated as contact pads) are also illustrated as being placed onto the raised surface 102 in FIG. 2. In this particular illustration, components 140 may be PCB bars, or other electrical connectors to provide a vertical connection. Alternatively, components 140 can be replaced with pre-formed pillars, such as plated copper pillars. Such copper pillars can be pre-formed prior to pick and place operations for the other components.

Figure 3:
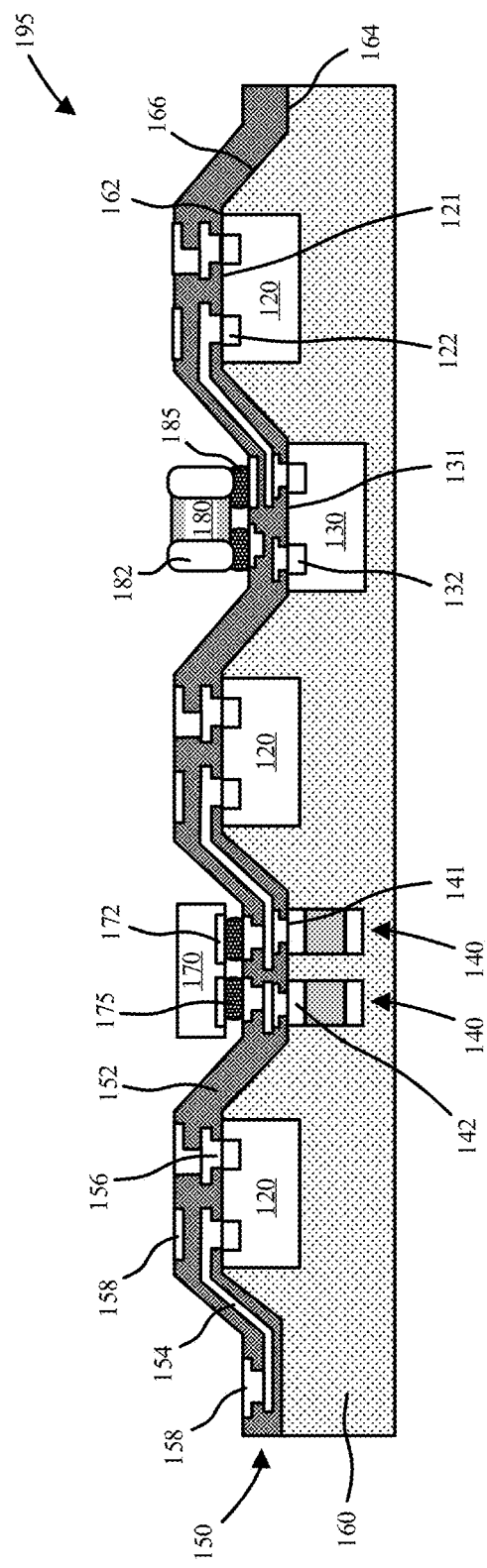
FIG. 3 is a schematic cross-sectional side view illustration of a reconstituted fanout substrate in accordance with embodiments.

FIG. 3 is a schematic cross-sectional side view illustration of a reconstituted fanout substrate 195 in accordance with embodiments. Specifically, the reconstituted fanout substrate 195 of FIG. 3 may be formed by molding the structure of FIG. 2 with a molding compound layer 160, removing the carrier substrate 100, and forming a wiring layer 150 over a multiple level topography of the molding compound layer 160, the first components 120 and the optional second components 140. Wiring layer 150 may be characterized as a redistribution layer (RDL) including one or more redistribution lines 154 and dielectric layers 152. The material of redistribution lines 154 can be formed from a metallic material such as: copper (Cu); titanium (Ti); nickel (Ni); gold (Au); a combination of at least one of Ti, Ni, Au, or Cu; or other suitable metals, alloys, or combinations of metals and/or alloys. A dielectric layer 152 can be any suitable insulating materials such as an oxide, or polymer (e.g. polyimide). In an embodiment, a redistribution line 154 or vias 156 of wiring layer 150 is formed on the terminals 122, 132, 142 of the respective components, and may be formed directly on the terminals, using a suitable technique such as sputtering or plating, followed by etching to form the redistribution line. Alternatively, the redistribution lines 154 and vias 156 may be formed using an adaptive wiring technique. A wiring layer 150 including multiple redistribution lines 154 and dielectric layers 152 can be formed using a sequence of deposition and patterning resulting in the structure illustrated in FIG. 3, terminating with landing pads 158, which may be underbump metallurgy (UBM) pads.

As shown, the wiring layer 150 may adopt the multiple level topography of the underlying molded surface profile, which is obtained from the patterned carrier substrate 100. As shown, the molded surface profile with multiple levels can include a top surface 162, floor surface 164 and mold sidewalls 166. The top surface may include the face 121 of the first component 120 and molding compound layer 160 transferred from the lower surface 104 of the carrier substrate 100. The floor surface 164 may include the face 131, 141 of either component 130, 140 for example, and the molding compound layer 160 transferred from the raised surface 102 of the carrier substrate 100. Mold sidewalls 166 likewise may be transferred from the sidewalls 106 of the carrier substrate. As shown, the mold sidewalls 166 may be tapered to allow for the formation of wiring layer 150 including redistribution lines 154 that may span over the mold sidewalls 166 to provide electrical connections from areas over the top surface 162 and floor surface 164 of the molded surface profile.

One or more additional components can then be mounted on the wiring layer 150. As shown a component 170, 180 is mounted using typical flip chip connection with an electrically conductive material 175, 185 such as solder, conductive paste, anisotropic conductive film, etc. By way of illustration, components 170 are illustrated as die-type components with terminals 172, and components 180 are illustrated as passive-type components (e.g. resistor, capacitor, inductor, etc.) with terminals 182. In an embodiment, the components 170, 180 are mounted on the wiring layer 150 over the floor surface 164 of the molded surface profile. Thus, the components 170, 180 can be mounted into the recessed regions for z-height reduction.

Figure 4:
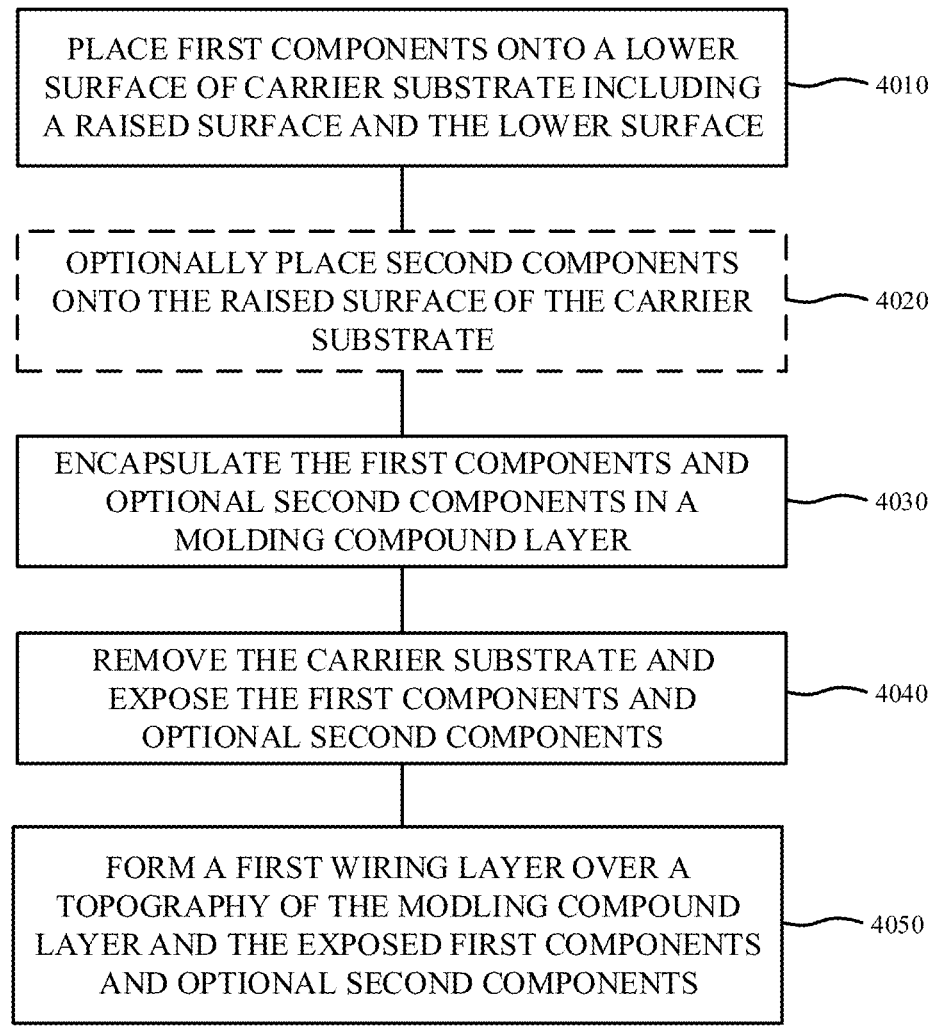
FIG. 4 is a flow diagram for a method of forming a reconstituted fanout substrate in accordance with an embodiment.

FIG. 4 is a flow diagram for a method of forming a reconstituted fanout substrate in accordance with an embodiment. FIGS. 5A-5E are schematic cross-sectional side view illustrations for a method of forming a reconstituted fanout substrate in accordance with an embodiment. In interest of clarity and conciseness, the structures and process flow of FIGS. 4 and 5A-E are described together in the following description.

Figure 5A:
FIGS. 5A-5E are schematic cross-sectional side view illustrations for a method of forming a reconstituted fanout substrate in accordance with an embodiment.
Figure 5B:
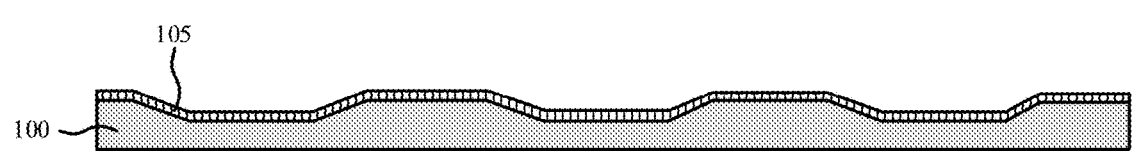
Figure 5C:
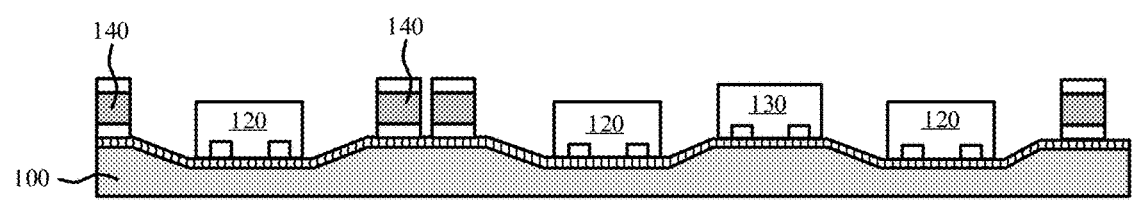

Referring to FIG. 5A, the process sequence can begin with a patterned carrier substrate 100 as described with FIGS. 1A-1B. A double sided adhesive film 105 may optionally be applied over the carrier substrate 100 as shown in FIG. 5B to facilitate attachment of the various components. Referring now to FIG. 5C, at operation 4010 first components 120 are placed onto the lower surface 104 of the carrier substrate 100. At operation 4020 second components (illustrated as components 130 and/or 140) are optionally placed on the raised surface 102 of the carrier substrate 100. In an embodiment the second components include vertical interconnects, such as a PCB bar. In another embodiment, the second components can be replaced by or supplemented with pre-formed pillars (e.g. copper pillars) that may have been pre-formed on the carrier substrate 100.

Figure 5D:
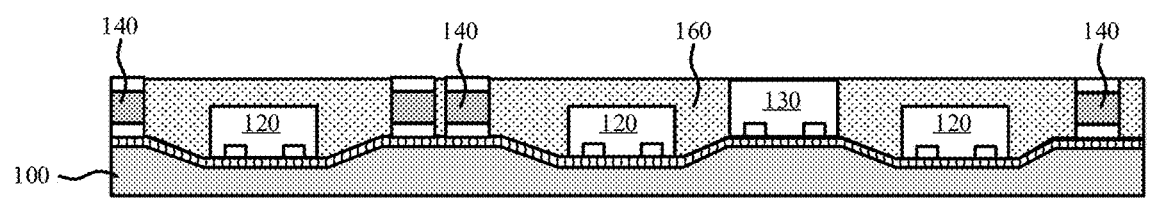
Figure 5E:
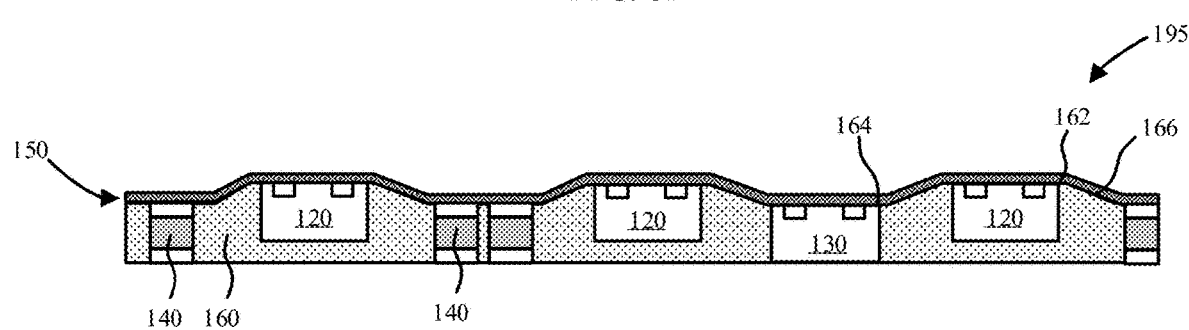

The first components 120 and optional second components are then encapsulated in a molding compound layer at operation 4030 as shown in FIG. 5D. In an embodiment, the molding compound layer (at least partially) laterally surrounds the first components and optional second components between the sidewalls 106, and what will become mold sidewalls 166. The carrier substrate 100 is then removed at operation 4040 along with the double sided adhesive film 105 to expose the first components 120 and optional second components. In accordance with embodiments, at operation 4050 a wiring layer 150 may then be formed over a topography of the molding compound layer 160 and faces of the exposed first components 120 and optional second components 130 as illustrated in FIG. 5E, and described in detail with regard to FIG. 3. As this stage a reconstituted fanout substrate 195 is formed with a topography that can accommodate components of different thicknesses. Such a reconstituted fanout substrate 195 can then be further processed and singulated to form a variety of package structures, where singulation may include cutting through at least the wiring layer 150 and molding compound layer 160.

Up until this point a generic processing sequence has been described for the formation of a reconstituted fanout substrate 195 that can accommodate multiple components with different thicknesses. Various packaging solutions are illustrated in FIGS. 6-8B that leverage the reconstituted fanout substrate 195.

Figure 6:
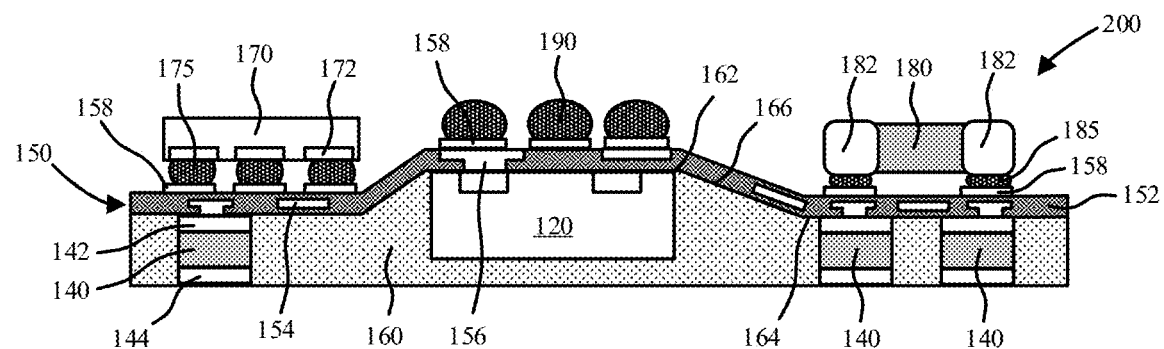
FIG. 6 is a schematic cross-sectional side view illustration of a package with a single molding compound layer in accordance with an embodiment.

Referring now to FIG. 6, a cross-sectional side view illustration is provided of a package 200 with a single molding compound layer 160 in accordance with an embodiment. In the particular embodiment illustrated in FIG. 6, one or more additional components 170, 180 are mounted on the wiring layer 150 directly over the floor surface 164 of the molded surface profile similarly as previously described and illustrated with regard to FIG. 3. A plurality of conductive bumps 190, such as solder bumps, can be placed on the wiring layer 150 directly over the top surface 162 of the molded surface profile, followed by singulation of packages 200. In this manner, the package 200 includes a wiring layer 150 that can accommodate underside components when mounted onto a module substrate with conductive bumps 190, while using a single molding compound layer 160. Furthermore, where second components 140 are vertical interconnect structures, such as PCB bars, the vertical interconnect structures can facilitate package on package (PoP) integration.

Figure 7:
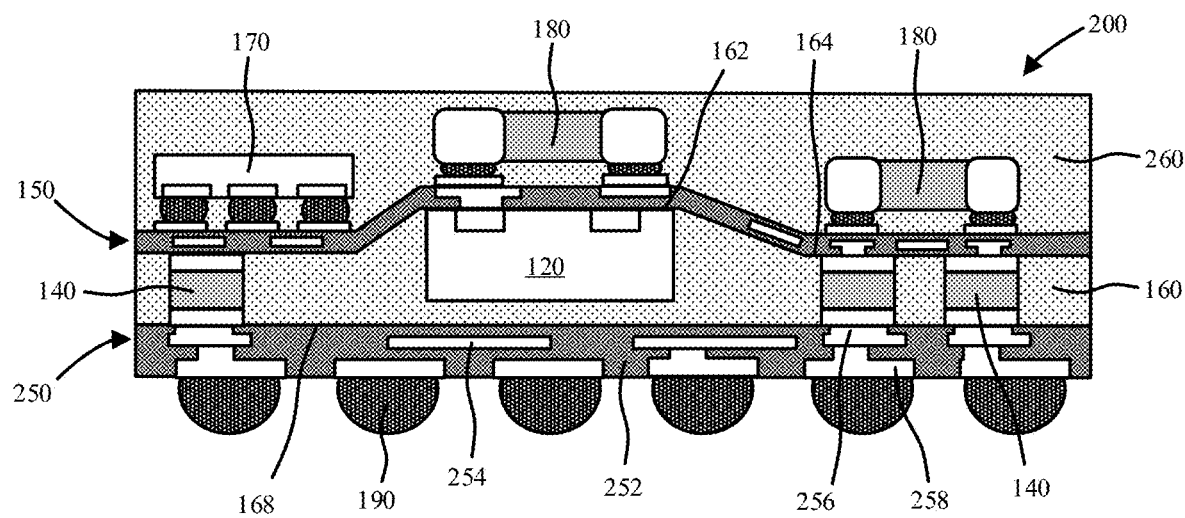
FIG. 7 is a schematic cross-sectional side view illustration of a package with multiple molding compound layers in accordance with an embodiment.

FIG. 7 is a schematic cross-sectional side view illustration of a package 200 with multiple molding compound layers in accordance with an embodiment. In such an embodiment, a second molding compound layer 260 is formed on the wiring layer 150 encapsulating the one or more additional components 170, 180. A second wiring layer 250 can be formed on a back side 168 of the molding compound layer 160 and in electrical connection with the second components 140. Thus, the second components 140, such as PCB bars, can provide electrical connection between the wiring layer 150 and second wiring layer 250. In an alternative sequence, the second wiring layer 250 could be formed prior to removal of the carrier substrate 100, such as after the molding operation 4030 illustrated in FIG. 5D.

The second wiring layer 250 may be formed similarly as wiring layer 150 including redistribution lines 254 and vias 256, dielectric layers 252 and landing pads 258 similarly to those redistribution lines 154 and vias 256, dielectric layers 152 and landing pads 158. Unlike wiring layer 150, the second wiring layer 250 may be formed on a planar back side 168 of the molding compound layer 160. This may facilitate a surface profile mounting the package 200 onto a module substrate. For example, the back side 168 may be planar as a result of the molding cavity used, or a separate polishing operation after molding.

Figure 8A:
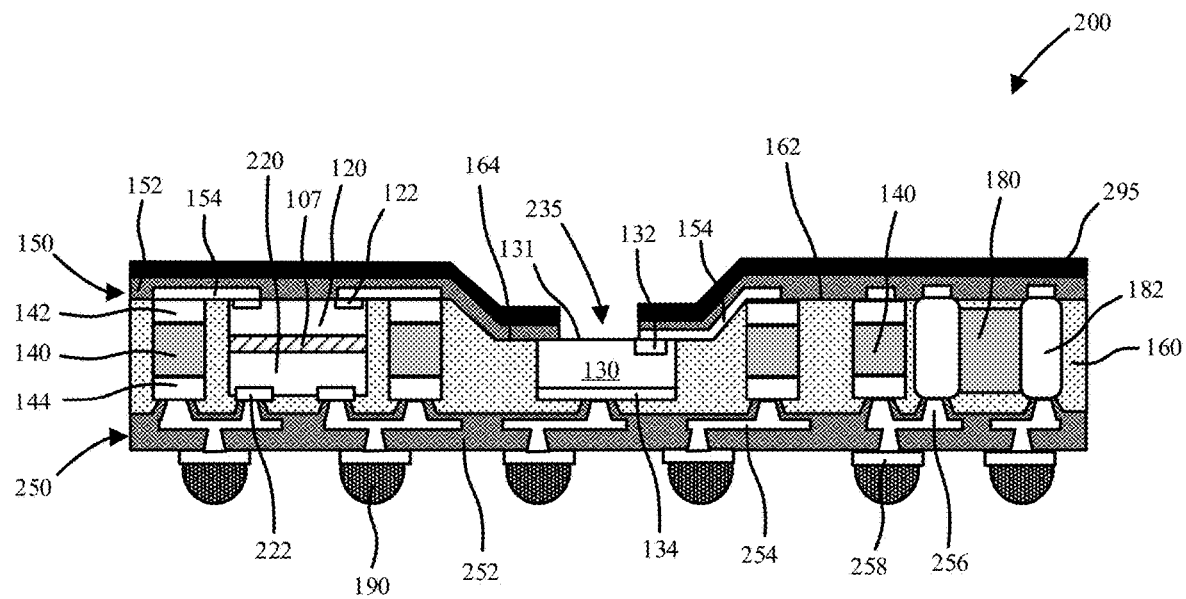
FIGS. 8A-8B are schematic cross-sectional side view illustration of packages with multiple wiring layers in accordance with embodiments.
Figure 8B:
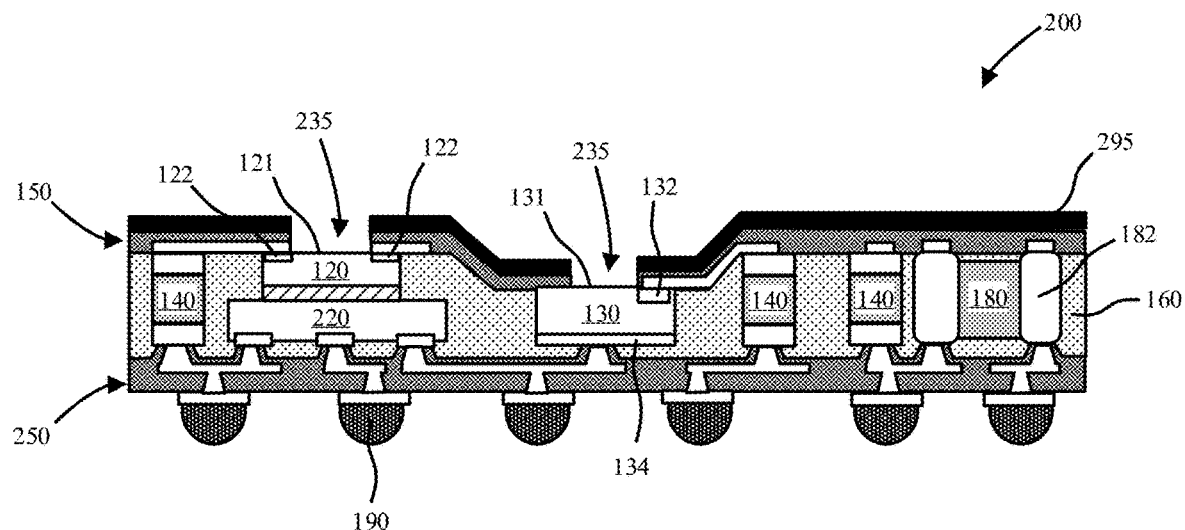

FIGS. 8A-8B are schematic cross-sectional side view illustration of optical packages with multiple wiring layers in accordance with embodiments. Generally, FIGS. 8A-8B illustrate several features already described and illustrated with regard to the embodiments illustrated in FIGS. 6-7 including a single molding compound layer 160, and multiple wiring layers 150, 250. In addition, FIGS. 8A-8B illustrate integration of components with only front side connections and components with both front/back side connections while encapsulated in the same molding compound layer 160. In particular, FIGS. 8A-8B illustrate exemplary optical package 200 embodiments in which one or more components may be optical components such as emitters, photodetectors, etc.

In the particular embodiments illustrated, component 130 may include both a front side terminal 132 on its face 131 and back side terminal 134. For example, component 130 may be a photodetector (PD), where front side and back side terminals 132, 134 correspond to p/n contacts for a photodiode. Various other components can be encapsulated within the molding compound layer 160, including back-to-back stacked components 120, 220 which may be thin dies stacked together with a die attach film 107, components 140 such as PCB bars to provide electrical connection between the wiring layer 150 and second wiring layer 250, and other components 180, such as passive devices (e.g. capacitor, resistor, inductor) with terminals 182 connected to either or both the wiring layer 150 and second wiring layer 250. In an embodiment, the wiring layer 150 is formed directly on the top terminals 142 of the additional components 140 such as PCB bars along the top surface 162 of the molded surface profile, and the second wiring layer is on (and may be directly on) and in electrical contact with the bottom terminal 144 of each of the one or more additional components 140 as well as on terminals 222 of component 220, terminal 134 of component 130, and terminals of components 180. For example, redistribution lines 254 or vias 256 can be formed directly on the bottom terminals for all components encapsulated in the molding compound layer 160.

In an embodiment an optical window 235 is formed in the wiring layer 150 directly over the face 131 of the second component 130. Such an optical window may be an opening in the wiring layer 150, or transparent materials. In an embodiment, a black matrix layer 295 is formed on top of the wiring layer 150, also with an opening over the optical window 235. In some embodiments the dielectric layer(s) 152 may be formed in whole or in part of transparent oxides, polymers, and the like. Redistribution lines 154 may also be formed of transparent conductive oxides (TCOs), including but not limited to indium tin oxide (ITO), and/or transparent conductive polymers. The use of optically transparent materials in whole or in part for dielectric layers 152 and/or redistribution lines 154 assist light transmitting to/from an optical component. Conductive metals, e.g., copper, may still be used to form the redistribution lines 154, when terminals of the optical components are outside the optical aperture of the component. Dielectric layers may also be formed in whole or in part of standard oxide, nitride, and polymer materials.

Referring now to FIG. 8B additional features are described for package 200 including multiple optical components. In the illustrated embodiment, another optical window 235 is formed in the wiring layer 150 directly over the face 121 of component 120. For example, component may be an optical component, such as an emitter, with multiple front side terminals 122. For example, these may be p/n contacts for a light emitting diode. The optical window 235 and black matrix layer 295 may be similarly formed as described for the optical window over component 130.

Still referring to FIG. 8B, in the particular embodiment illustrated, component 220 may be a controller chip such as an application-specific integrated circuit (ASIC) or a field-programmable gate array (FPGA) which is in electrical communication with one or both of components 120, 130 though the wiring layers 250, 150, and components 140 (e.g. vertical interconnects, such as PCB bars).

Figure 9A:
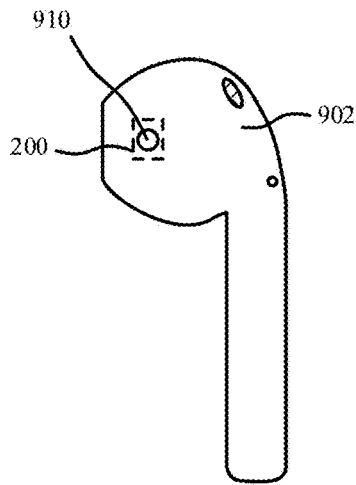
FIGS. 9A-9B are schematic side view illustrations of an earbud in accordance with an embodiment.
Figure 9B:
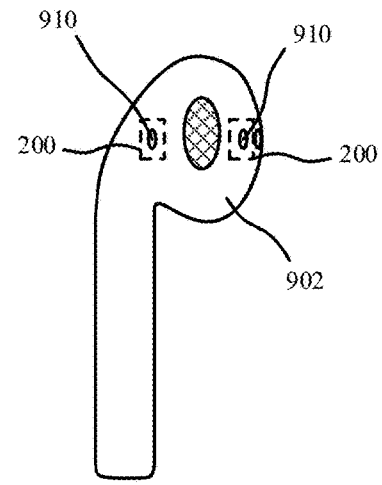
Figure 10:
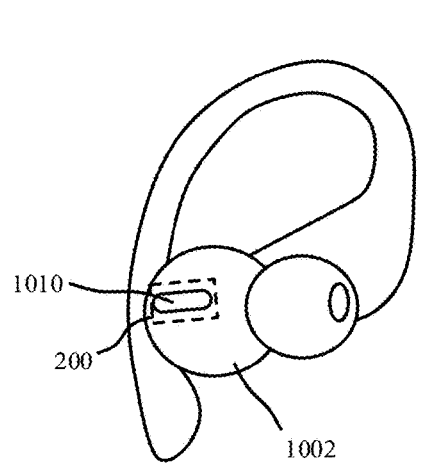
FIG. 10 is a schematic side view illustration of an earpiece in accordance with an embodiment.
Figure 11:
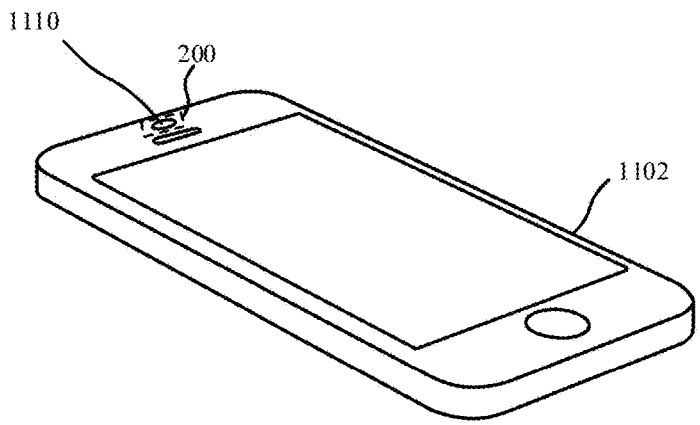
FIG. 11 is a schematic side view illustration of a mobile phone in accordance with an embodiment.

FIGS. 9A-11 illustrate various portable electronic devices in which the various embodiments can be implemented. FIGS. 9A-9B are schematic side view illustrations of an earbud in accordance with an embodiment that includes a housing 902 and one or more openings 910 to which the optical components (e.g. PD, emitter) of the packages 200 described herein can be aligned adjacently. FIG. 10 is a schematic side view illustration of an earpiece in accordance with an embodiment that includes a housing 1002 including an opening 1010 to which the optical components (e.g. PD, emitter) of the packages 200 described herein can be aligned adjacently. FIG. 11 is a schematic side view illustration of a mobile phone in accordance with an embodiment including a housing 1102 including an opening 1110 to which the optical components (e.g. PD, emitter) of the packages 200 described herein can be aligned adjacently. These illustrations are intended to be exemplary and non-exhaustive implementations.

In utilizing the various aspects of the embodiments, it would become apparent to one skilled in the art that combinations or variations of the above embodiments are possible for forming a fan out system in package including multiple components of different thicknesses. In particular, the reconstituted fanout substrate including a wiring layer fabricated to custom elevation within the package can accommodate multiple components with different thicknesses while also reducing package z-height. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
    a first component and a second component encapsulated in a molding compound layer,
    wherein a topography of the molding compound layer includes a molded surface profile including a top surface, a floor surface, and mold sidewalls extending from the floor surface to the top surface; and
    a wiring layer formed over and spanning the top surface, the floor surface, and the mold sidewalls of the molded surface profile and directly on a first face of the first component along the top surface of the molded surface profile and directly on a second face of the second component along the floor surface of the molded surface profile.

2. The package of claim 1, further comprising one or more additional components mounted on the wiring layer directly over the floor surface of the molded surface profile.

3. The package of claim 2, further comprising a plurality of conductive bumps on the wiring layer directly over the top surface of the molded surface profile.

4. The package of claim 2, further comprising a second molding compound layer encapsulating the one or more additional components mounted on the wiring layer.

5. The package of claim 4, further comprising a second wiring layer formed on a back side of the molding compound layer and in electrical connection with the second component, wherein the second component comprises a vertical interconnect between the wiring layer and the second wiring layer.

6. The package of claim 1, further comprising a second wiring layer formed on a back side of the molding compound layer and in electrical connection with the second component.

7. The package of claim 6, wherein the second wiring layer formed on a planar back side of the molding compound layer.

8. The package of claim 6:
    further comprising one or more additional components encapsulated in the molding compound layer; and
    wherein the wiring layer is formed directly on a top side terminal of each of the one or more additional components along the top surface of the molded surface profile.

9. The package of claim 8, second wiring layer is on and in electrical connection with a bottom side terminal of each of the one or more additional components.

10. The package of claim 6, further comprising an optical window in the wiring layer directly over the second face of the second component.

11. The package of claim 10, wherein the second wiring layer is in electrical connection with a back side terminal of the second component.

12. The package of claim 11, further comprising another optical window in the wiring layer directly over the first face of the first component.

13. The package of claim 12, further comprising a third component encapsulated in the molding compound layer, wherein the third component is stacked back-to-back with the first component.

14. The package of claim 13, wherein the first component is an emitter, and the second component is a photodetector, and the third component is a controller chip.

15. A method of forming a package comprising:
placing first components onto a lower surface of a carrier substrate and placing second components onto a raised surface of the carrier substrate, wherein the carrier substrate includes the raised surface, the lower surface and sidewalls extending between the lower surface and the raised surface;
encapsulating the first components and the second components in a molding compound layer, wherein the molding compound layer laterally surrounds the first components between the sidewalls, and wherein a topography of themolding compound layer includes a molded surface profile including a top surface, a floor surface, and a plurality of mold sidewalls extending from the floor surface to the top surface;
removing the carrier substrate and exposing the first components; and
forming a wiring layer over and spanning the top surface, the floor surface, and the plurality of mold sidewalls of the molded surface profile and directly on first faces of the first components along the top surface of the molded surface profile and directly on second faces of the second components along the floor surface of the molded surface profile.

16. The method of claim 15, further comprising cutting through the wiring layer and the molding compound layer to singulate a plurality of packages.

* * * * *